(12) United States Patent
Chu et al.

(10) Patent No.: US 11,942,377 B2
(45) Date of Patent: Mar. 26, 2024

(54) GATE STRUCTURE AND PATTERNING METHOD

(71) Applicant: Taiwan Semiconductor Manufacturing Co., Ltd., Hsinchu (TW)

(72) Inventors: Lung-Kun Chu, New Taipei (TW); Mao-Lin Huang, Hsinchu (TW); Wei-Hao Wu, Hsinchu (TW); Kuo-Cheng Chiang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 56 days.

(21) Appl. No.: 17/682,298

(22) Filed: Feb. 28, 2022

(65) Prior Publication Data
US 2022/0181218 A1  Jun. 9, 2022

Related U.S. Application Data

(62) Division of application No. 16/381,232, filed on Apr. 11, 2019, now Pat. No. 11,264,288.

(60) Provisional application No. 62/738,670, filed on Sep. 28, 2018.

(51) Int. Cl.
*H01L 29/40* (2006.01)
*H01L 21/3213* (2006.01)
*H01L 21/8238* (2006.01)
*H01L 27/092* (2006.01)
*H01L 29/423* (2006.01)

(52) U.S. Cl.
CPC ........ *H01L 21/823842* (2013.01); *H01L 21/32134* (2013.01); *H01L 21/823821* (2013.01); *H01L 27/0924* (2013.01); *H01L 29/401* (2013.01); *H01L 29/42372* (2013.01)

(58) Field of Classification Search
CPC ....... H01L 29/66545; H01L 21/823842; H01L 29/785; H01L 21/823431; H01L 21/823821; H01L 27/0924; H01L 27/0886; H01L 29/42392
See application file for complete search history.

(56) References Cited

U.S. PATENT DOCUMENTS 9,209,186 B1 * 12/2015 Togo ................. H01L 29/4958
9,455,202 B2 *  9/2016 Lee .......................... G03F 1/00
9,530,778 B1 * 12/2016 Lin ........................ H01L 29/517
(Continued)

*Primary Examiner* — Jaehwan Oh
(74) *Attorney, Agent, or Firm* — HAYNES AND BOONE, LLP

(57) ABSTRACT

A semiconductor device includes a semiconductor substrate; a plurality of channel regions, including a p-type channel region and an n-type channel region, disposed over the semiconductor substrate; and a gate structure. The gate structure includes a gate dielectric layer disposed over the plurality of channel regions and a work function metal (WFM) structure disposed over the gate dielectric layer. The WFM structure includes an n-type WFM layer over the n-type channel region and not over the p-type channel region and further includes a p-type WFM layer over both the n-type WFM layer and the p-type channel region. The gate structure further includes a fill metal layer disposed over the WFM structure and in direct contact with the p-type WFM layer.

20 Claims, 17 Drawing Sheets

(56) References Cited

U.S. PATENT DOCUMENTS

| | | | |
|---|---|---|---|
| 10,056,390 B1* | 8/2018 | Liaw | H01L 29/1054 |
| 10,643,904 B2* | 5/2020 | Xie | H01L 29/4966 |
| 2007/0138559 A1* | 6/2007 | Bohr | H01L 29/4966 |
| | | | 257/E21.204 |
| 2011/0147831 A1* | 6/2011 | Steigerwald | H01L 29/785 |
| | | | 257/330 |
| 2011/0272764 A1* | 11/2011 | Kim | H01L 23/5256 |
| | | | 257/E27.06 |
| 2015/0091100 A1* | 4/2015 | Xie | H01L 29/7851 |
| | | | 438/424 |
| 2015/0348850 A1* | 12/2015 | Lee | H01L 21/823842 |
| | | | 438/587 |
| 2017/0117190 A1* | 4/2017 | Chung | H01L 29/4966 |
| 2017/0162675 A1* | 6/2017 | Yim | H01L 21/31058 |
| 2018/0122709 A1* | 5/2018 | Xie | H01L 27/092 |
| 2019/0088555 A1* | 3/2019 | Xie | H01L 29/517 |
| 2019/0131418 A1* | 5/2019 | Ando | H01L 21/28568 |
| 2019/0333769 A1* | 10/2019 | Chen | H01L 29/66545 |
| 2019/0371912 A1* | 12/2019 | Bao | H01L 21/823842 |

\* cited by examiner

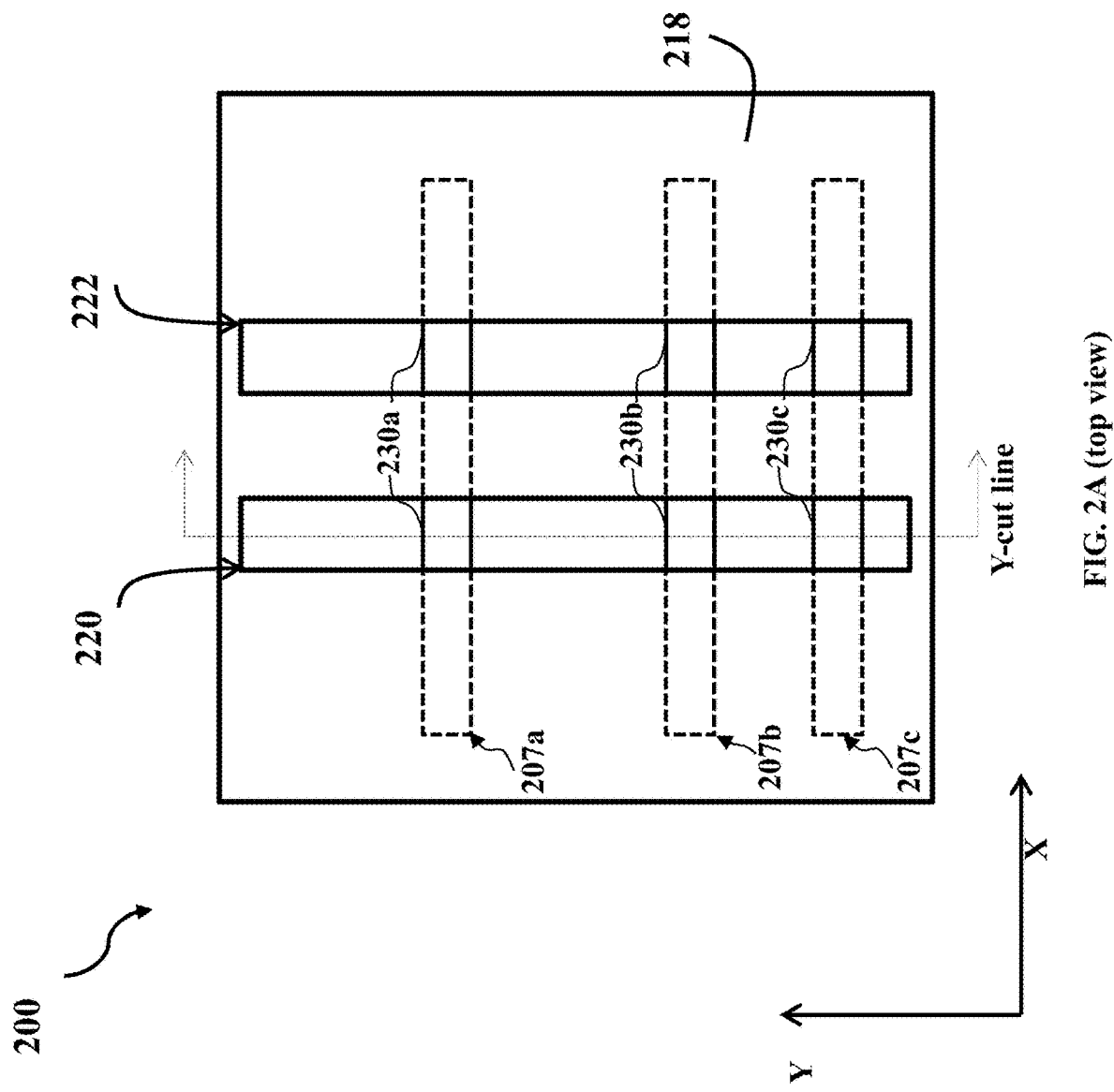
FIG. 2A (top view)

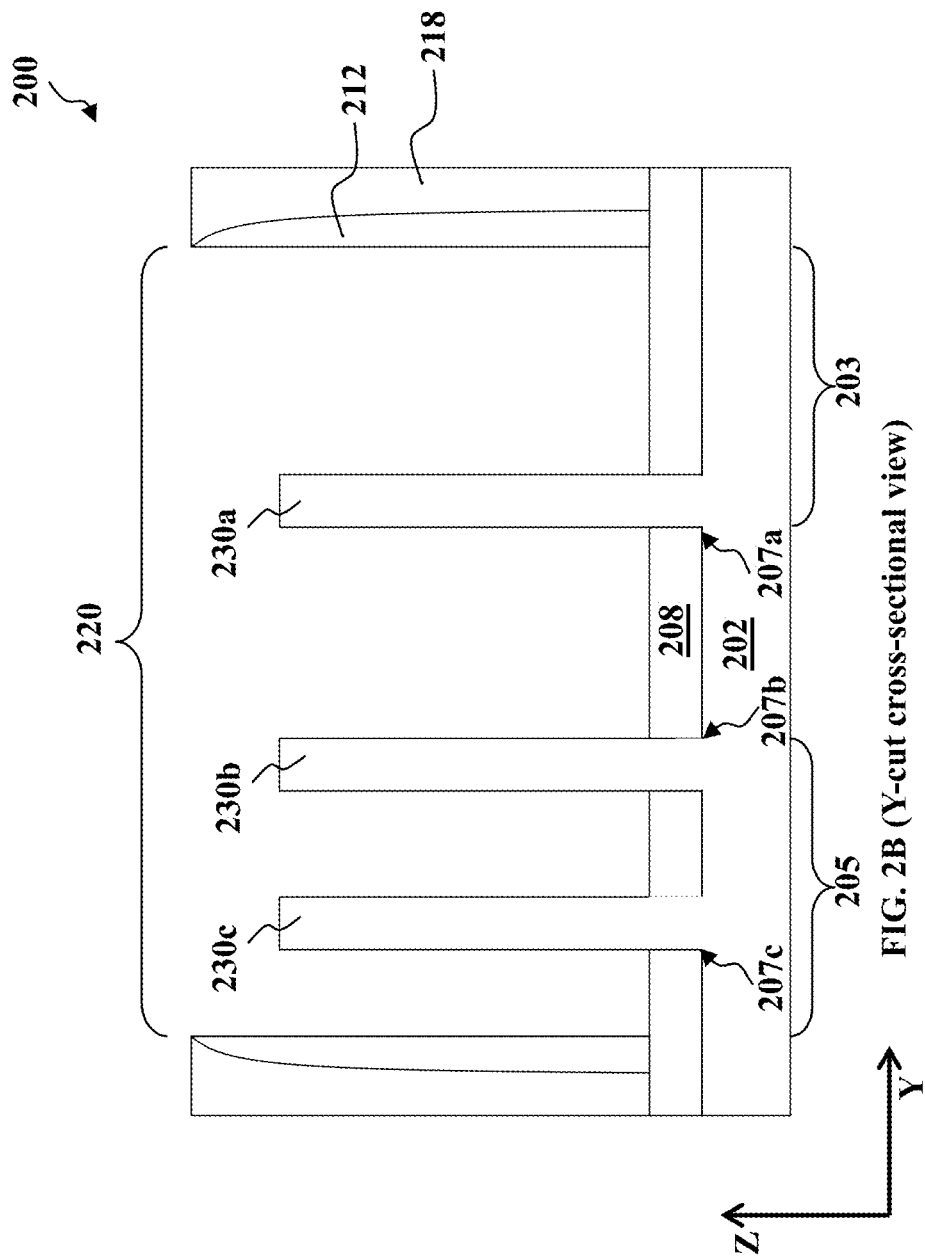
FIG. 2B (Y-cut cross-sectional view)

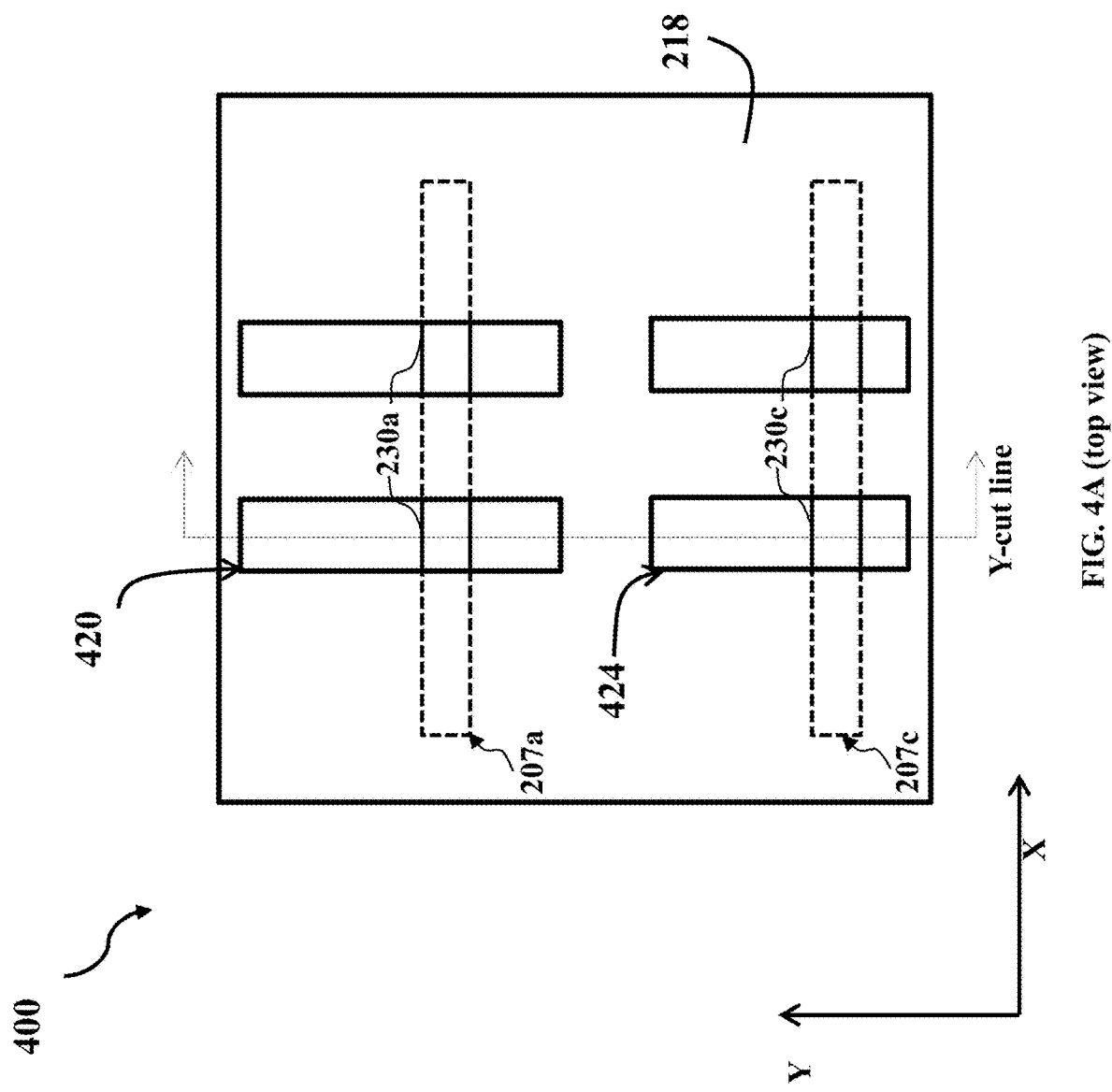
FIG. 4A (top view)

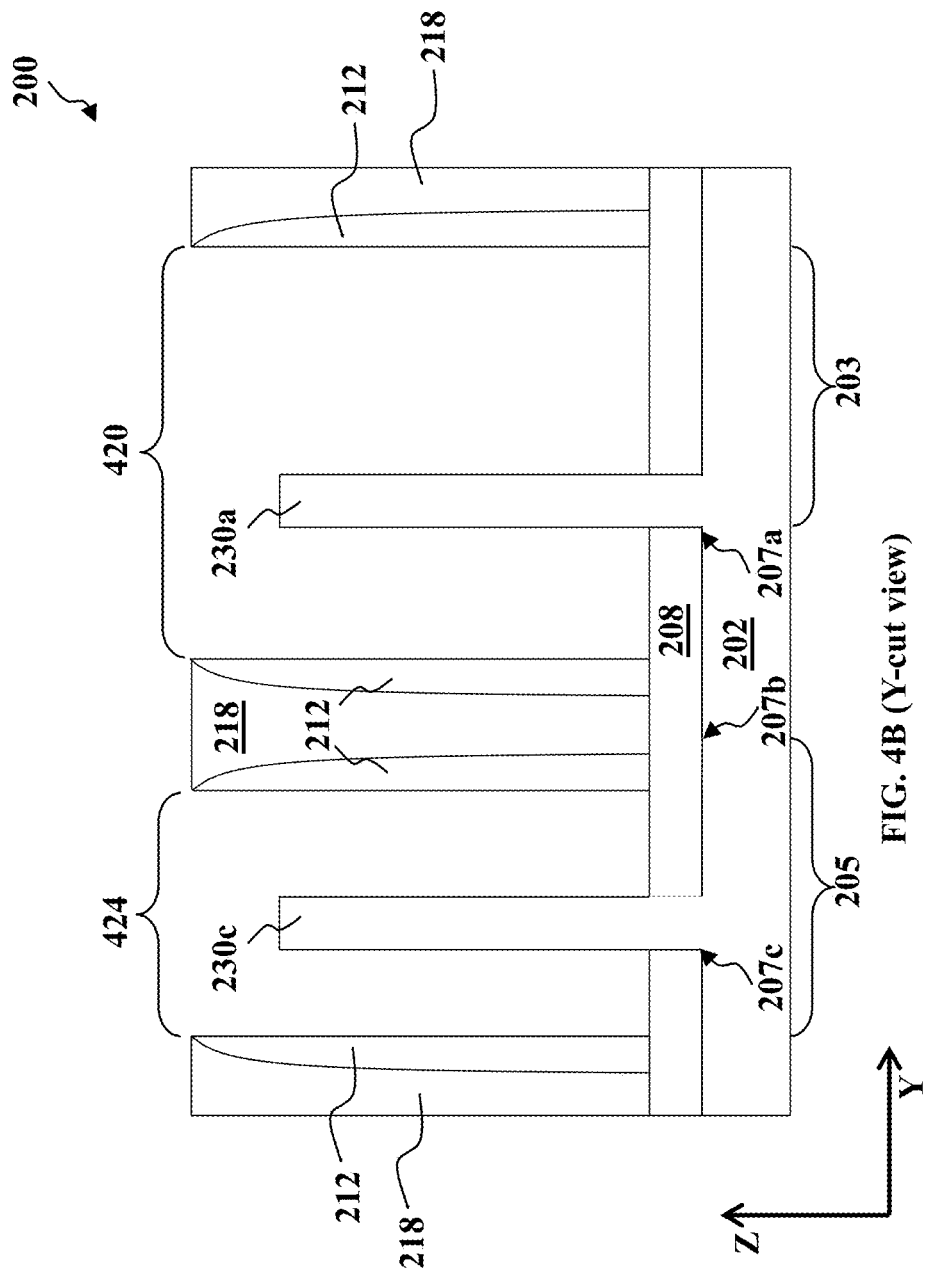
FIG. 4B (Y-cut view)

GATE STRUCTURE AND PATTERNING METHOD

PRIORITY

This is a divisional of U.S. patent application Ser. No. 16/381,232 filed Apr. 11, 2019, which claims priority to U.S. Provisional Patent Application Ser. No. 62/738,670 filed Sep. 28, 2018, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, gate replacement processes, which typically involve replacing polysilicon gate electrodes with metal gate electrodes, have been implemented to improve device performance, where work function values of the metal gate electrodes are designed to provide different FinFETs with different threshold voltages. Although existing FinFETs providing multiple threshold voltages have been generally adequate for their intended purposes, they have not been entirely satisfactory in all respects as IC technologies shrink.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a top view of an embodiment of a semiconductor device according to various aspects of the present disclosure.

FIG. 2B is a Y-cut cross-sectional view of the same semiconductor device as FIG. 2A according to various aspects of the present disclosure.

FIG. 4A is a top view of another embodiment of a semiconductor device according to various aspects of the present disclosure.

FIG. 4B is a Y-cut cross-sectional view of the same semiconductor device as FIG. 4A according to various aspects of the present disclosure.

DETAILED DESCRIPTION

Figure 1:
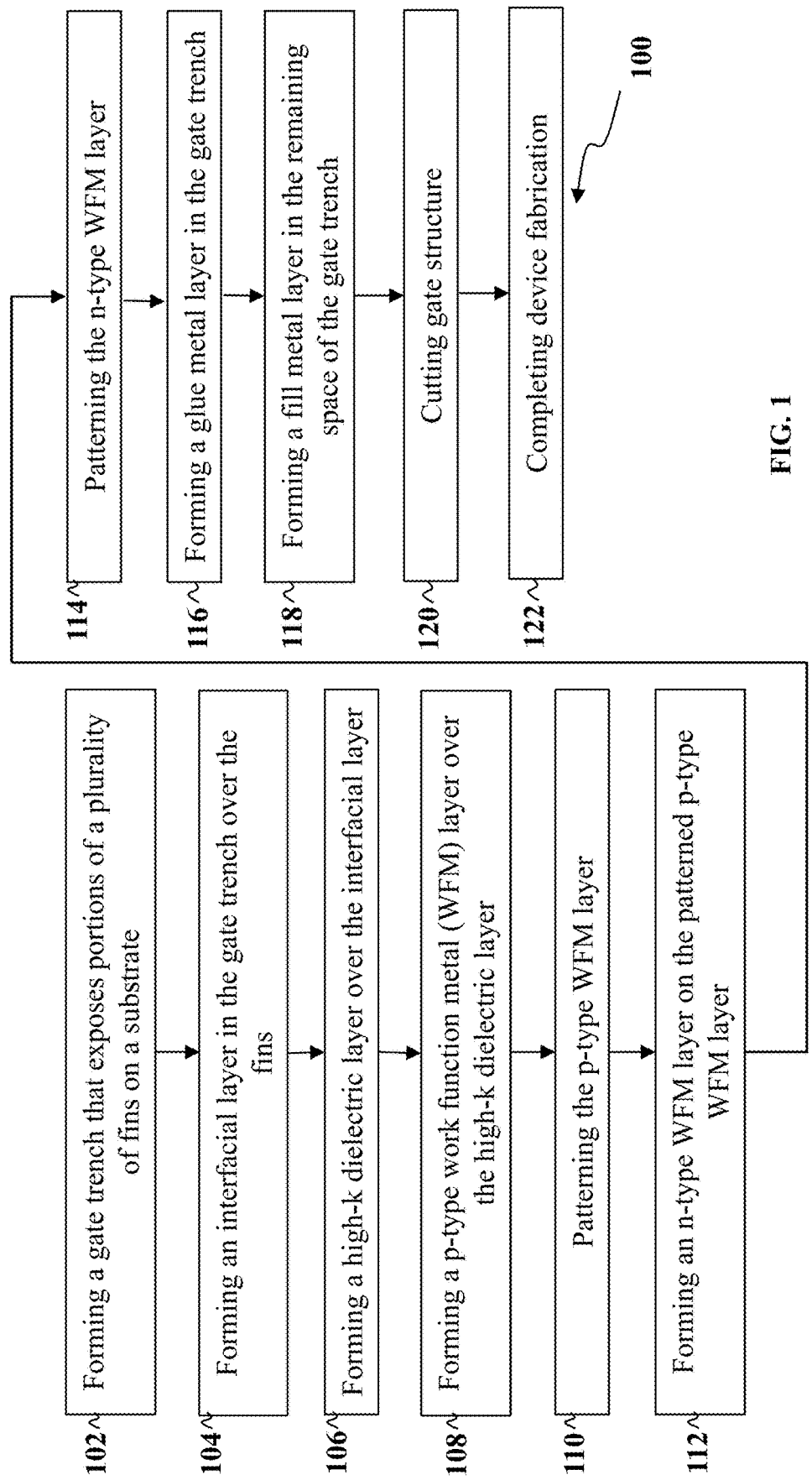
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

During fabrication of a FinFET device, a gate replacement process may be implemented to adjust threshold voltage (Vt) associated with the fabrication steps. For example, during a "gate-last" process, a dummy gate structure is first formed over a substrate as a placeholder before forming other components, e.g., source/drain features. Once the other components have been formed, the dummy gate structure is removed, and a metal gate structure is formed in its place. Multiple patterning processes may be implemented to form various material layers within the metal gate structure to provide certain device capabilities such as multiple threshold voltages. Multi-threshold voltage (Vt) devices enable flexible and diverse applications of field effect transistors (FETs).

Multiple threshold voltages of the FinFET device have been accomplished by stacking multiple work function metal (WFM) layers in the metal gate structure. In one example, a thicker WFM stack leads to a higher work function and a higher threshold voltage (Vt). However, as device feature sizes decrease, many challenges arise when stacking WFM layers. For example, because of decreased fin-to-fin pitches, the ability to stack WFM layers has become limited because such WFM layers across multiple fins are prone to merging.

The present disclosure contemplates metal gate structures that use less WFM layers to realize multiple threshold voltages. According to some aspects, a WFM structure disclosed herein includes a p-type WFM portion that is thinner than—but still provides a higher work function than—an n-type WFM portion. In some embodiments, such a WFM structure is fabricated by patterning an n-type WFM layer directly on a high-k dielectric layer (without any high-k cap layer therebetween) based on etch selectivity between the n-type WFM layer and the high-k dielectric layer, and then forming a glue metal layer over the patterned n-type WFM layer. The p-type WFM portion contains the glue metal layer (which also serves as a p-type WFM layer) but not the n-type WFM layer, while the n-type portion contains both the glue metal and the n-type WFM layer. Therefore, the p-type WFM portion is made thinner than the n-type WFM portion. Such a WFM structure allows for extremely high work functions (e.g., equal to or greater than 4.8 electron volts (eV)) and/or extremely low work functions (e.g., equal to or less than 4.4 eV) without having to stack many layers of WFM materials. The overall thickness is reduced compared to other WFM structures that have multiple threshold voltages. Thus, multiple threshold voltages may be realized in FinFET devices that have smaller fin-to-fin pitches.

Referring now to FIG. 1, a flow chart of a method 100 for forming a semiconductor device 200 is illustrated according to various aspects of the present disclosure. The method 100 is merely an example and is not intended to limit the present disclosure to what is explicitly illustrated in the method 100. Additional operations can be provided before, during, and after the method 100, and some operations described can be replaced, eliminated, or moved around for additional embodiments of the method. The method 100 is described below in conjunction with FIGS. 2A-2B and FIGS. 3A-3L, which illustrate a portion of the semiconductor device 200 during the method 100. FIG. 2A is a fragmentary top view of the device 200, and FIG. 2B is a fragmentary Y-cut cross-sectional view of the device 200 at the same stage. FIGS. 3A-3L are fragmentary Y-cut cross-sectional views of the device 200 (same view as FIG. 2B) at intermediate operations of the method 100. In FinFET devices, fins may extend in a first direction called an X-cut direction, and metal gates may extend in a second direction called a Y-cut direction. Thus, the Y-cut cross-sectional views in FIG. 2B and FIGS. 3A-3L run in parallel with a length direction of the metal gates and perpendicular to a length direction of the fins.

The device 200 may be an intermediate device (or an IC structure) fabricated during processing of an IC that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, although the device 200 as illustrated is a three-dimensional FinFET device, the present disclosure may also provide embodiments for fabricating planar FET devices.

Referring to FIG. 1 and FIGS. 2A-2B, at the beginning of the method 100 a starting semiconductor device 200 is provided and includes a substrate 202 having a first region 203 and a second region 205, isolation structures 208 formed over the substrate 202 separating various components of the device 200, gate spacers 212 as well as an interlayer dielectric (ILD) layer 218 formed on the isolation structures 208. In an embodiment, the first region 203 includes a fin 207a, while the second region 205 includes two fins, a fin 207b and a fin 207c. The fins 207a-207c may include FET features such as channel regions 230a, 230b, and 230c, respectively. Although not shown in the figures, source and drain features are also formed on each of fins 207a-207c (and separated by the channel regions 230a-230c). As shown in FIG. 2B, fins 207a-207c are aligned from right to left, but the present disclosure works with any order of the fins 207a-207c, which may or may not be immediately adjacent to each other.

At operation 102, gate trenches 220 and 222 are formed to expose the channel regions 230a-230c of the fins 207a-207c. As shown in FIG. 2B, the gate spacers 212 and the ILD layer 218 define two gate trenches 220 and 222, which are to be filled by metallic materials. From the top view of FIG. 2A, the fins 207a-207c are generally covered by the ILD layer 218, but the gate trenches 220 and 222 each expose a respective set of channel regions 230a-230c. For purpose of simplicity, the operations of the method 100 are illustrated with respect to the gate trench 220 (but not gate trench 222 as it undergoes the same fabrication processes).

In some embodiments, the gate trench 220 is formed by removing a dummy gate structure that engages the fins 207a-207c, thereby exposing the channel regions 230a-230c of the fins 207a-207c. The dummy gate structure removed at operation 102 may include one or more material layers, such as an oxide layer (i.e., a dummy gate dielectric layer), a poly-silicon layer (i.e., a dummy gate electrode), a hard mask layer, a capping layer, and/or other suitable layers. In an embodiment, forming the gate trench 220 includes performing an etch process that selectively removes the dummy gate structure using a dry etch process, a wet etch process, an ME, other suitable methods, or combinations thereof. A dry etch process may use chlorine-containing gases, fluorine-containing gases, and/or other etching gases. The wet etching solutions may include ammonium hydroxide ($NH_4OH$), hydrofluoric acid (HF) or diluted HF, deionized water, tetramethylammonium hydroxide (TMAH), and/or other suitable wet etching solutions.

As shown in FIGS. 2A and 2B, the substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with p-type dopants, such as phosphorus or arsenic, and/or n-type dopants, such as boron or $BF_2$, depending on design specifications. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques. In some embodiments, the source/drain regions are formed by an epitaxial growth method.

The first region 203 may be suitable for forming one or more p-type FinFETs, and the second region 205 may be suitable for forming one or more n-type FinFETs. Therefore, the channel region 230a located on the fin 207a is a p-type channel, and the channel regions 230b and 230c located on the fins 207b and 207c, respectively, are n-type channels. In alternative embodiments, the first region 203 and the second region 205 may be suitable for forming FinFETs of a similar type, i.e., both n-type or both p-type, with different threshold voltage (Vt) design specifications. This configuration in FIGS. 2A-2B is for illustrative purposes only and does not limit the present disclosure. The fins 207a-207c may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 207a-207c on the substrate 202. The etch process may include dry etching, wet etching, reactive ion etching (RIE), and/or other suitable processes.

Other methods for forming the fins 207a-207c may be suitable. For example, the fins 207a-207c may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 207a-207c. The trenches may then be filled with an isolating material described above, followed by a chemical mechanical planarization (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

The gate spacers 212 form sidewalls of the gate trench 220. The gate spacers 212 may include a dielectric material, such as silicon oxide, silicon nitride, silicon carbide, silicon oxynitride, and/or other suitable dielectric materials. The gate spacers 212 may be a single layered structure or a multi-layered structure. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 218 may include a multi-layer structure having multiple dielectric materials. Note that, although not shown in FIG. 2B, the device 200 may include many additional components or features such as source/drain features (formed on two ends of the channel region in each of fins 207a-207c, but outside of the cross-sectional view of FIG. 2B). In the interest of conciseness, the additional components are not described herein.

Figure 3A:
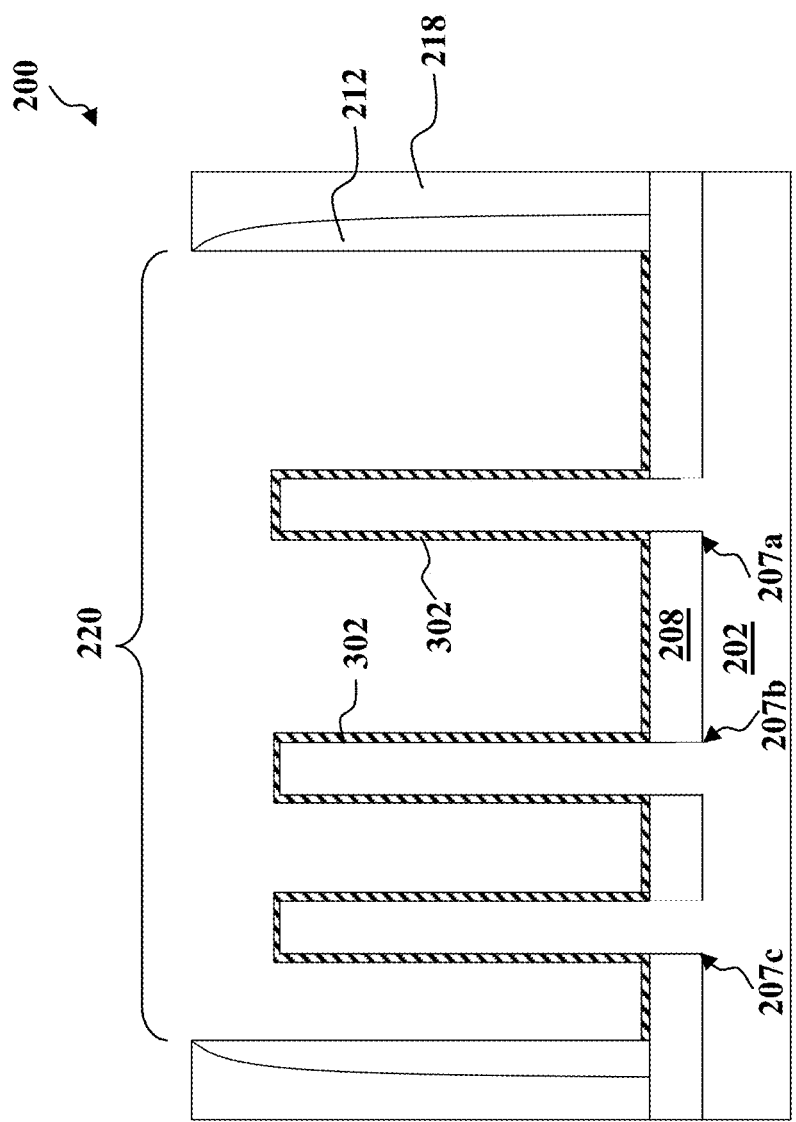
FIGS. 3A, 3B, 3C, 3D, 3E, 3F, 3G, 3H, 3I, 3J, 3K, and 3L are additional Y-cut cross-sectional views of an embodiment of the semiconductor device of FIGS. 2A and 2B during intermediate operations of the method of FIG. 1 according to various aspects of the present disclosure.

Referring to FIG. 1 and FIG. 3A, the method at operation 104 forms an interfacial layer (IL) 302 in the gate trench 220 over the fins 207a-207c. The interfacial layer 302 may include a dielectric material such as silicon oxide ($SiO_x$) or silicon oxynitride (SiON). The interfacial layer 302 may be formed to any suitable thickness such as about 0.5 nm to about 1.5 nm. In an embodiment, the interfacial layer 302 has a thickness of about 1 nm. The interfacial layer 302 may be formed by any suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), atomic layer CVD (AL-CVD), atmospheric pressure CVD (AP-CVD), and/or other suitable methods.

Figure 3B:
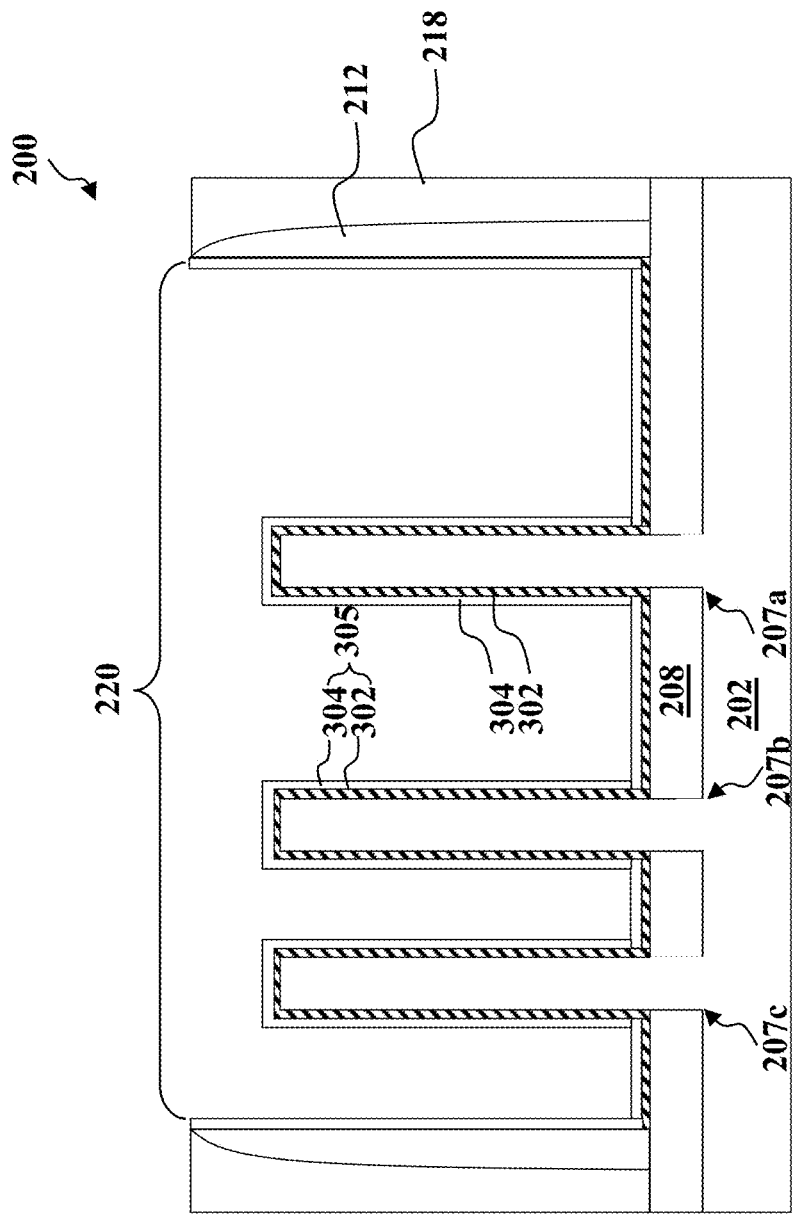

Referring to FIG. 1 and FIG. 3B, the method 100 at operation 106 forms a high-k dielectric layer 304 in the gate trench 220 over the interfacial layer 302. In the present disclosure, "high-k" dielectric generally refers to one or more materials having a dielectric constant greater than that of silicon dioxide ($SiO_2$). The high-k dielectric layer 304 may be formed by ALD and/or other suitable methods to any suitable thickness. In an embodiment, the high-k dielectric layer 304 has a thickness of about 1 nm to about 2 nm. Alternatively or additionally, the high-k dielectric layer 304 may be formed over an intermediate material layer such that the high-k dielectric layer 304 is not directly in contact with the interfacial layer 302. In some embodiments, the high-k dielectric layer 304 includes oxides based on hafnium, zirconium, silicon, and/or other suitable materials. For example, the high-k dielectric layer 304 may include hafnium oxide ($HfO_2$), hafnium silicon oxide ($HfSiO_x$), and/or hafnium zirconium oxide ($HfZrO_x$), etc. Since both the high-k dielectric layer 304 and the interfacial layer 302 are dielectric layers used in the gate structure, they are collectively referred to as a gate dielectric layer 305.

Following the formation of the gate dielectric layer 305, a work function metal (WFM) structure is formed thereon to provide necessary work functions to adjust threshold voltages for the subsequent transistors. Each fin may be used to implement a FinFET with a source, a drain, a channel, and a gate, and a threshold voltage of the fin refers to a minimum gate-to-source voltage needed to create a conducting path in the channel between the source and the drain. The threshold voltage is impacted by various parameters including the work function of the gate. As device feature sizes decrease, implementing thick WFM structures during lithography and patterning processes poses many challenges.

The present disclosure provides methods of modulating the threshold voltage of a gate structure using a thinner WFM structure 307. The formation process of the WFM structure 307 is described in detail further below, but it is helpful to first briefly describe an overview of the WFM structure 307. After being formed using various processes and embodiments disclosed herein, the WFM structure 307 eventually may include multiple metal layers, each designed to realize a certain desired work function. For example, in the final device 200 as illustrated in FIG. 3L (described further below), the WFM structure 307 includes a patterned p-type WFM layer 308, a patterned n-type WFM layer 310, and a glue metal layer 312. Further, since the WFM structure 307 spans across the fins 207a-207c, each of which desires a different work function, the WFM structure 307 may be divided into multiple portions (in the horizontal "Y" direction), each corresponding to a fin. For example, as shown in FIG. 3L (described further below), the WFM structure 307 includes three portions including: a p-type WFM portion 307a (formed over the p-type channel region 230a in the fin 207a); an n-type WFM portion 307c (formed over the n-type channel region 230c in the fin 207c); and a third, intermediate WFM portion 307b (formed over the channel region 230b in the fin 207b) that can be designed to be p-type or n-type depending on the application. In some embodiments, each of the WFM portions 307a-307c has a different thickness due to the different metal layers formed therein. For instance, as shown in FIG. 3L (described further below), the p-type WFM portion 307a includes only the glue metal layer 312; the n-type WFM portion 307c includes the n-type WFM layer 310 and the glue metal layer 312; and the intermediate WFM portion 307b includes the p-type WFM layer 308, the n-type WFM layer 310, and the glue metal layer 312. Thus, the p-type WFM portion 307a is thinner than the n-type WFM portion 307c, which in turn is thinner than the intermediate WFM portion 307b. Such a thickness profile departs from existing WFM structures where p-type WFM portions would be thicker than n-type WFM portions (because p-type channels use higher work functions than n-type channels). The formation process of the WFM structure 307 is described below.

Figure 3C:
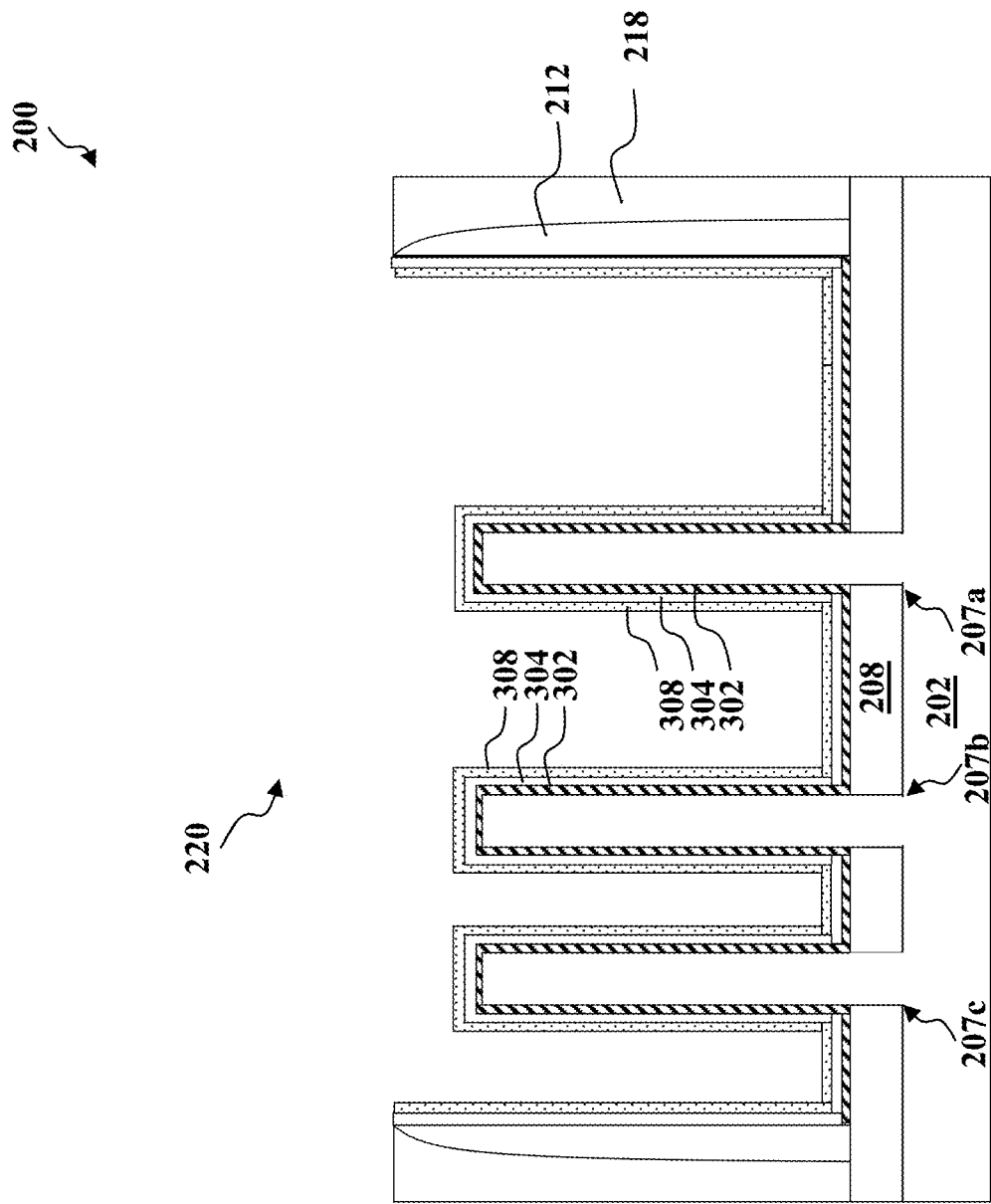

Referring to FIG. 1A and FIG. 3C, the method 100 at operation 108 forms (by deposition) the p-type WFM layer 308 over the high-k dielectric layer 304 in the gate trench 220. In many embodiments, the p-type WFM layer 308 is designed (in terms of material and/or thickness) to work with upper layers (e.g., the n-type WFM layer 310) to tune a work function (and thereby threshold voltage) on the fin 207b. The p-type WFM layer 308 may include a metal with a sufficiently large effective work function, selected from but not restricted to the group of titanium nitride (TiN), tantalum nitride (TaN), ruthenium (Ru), molybdenum (Mo), tungsten (W), platinum (Pt), tungsten carbon nitride (WCN), titanium aluminum nitride (TiAlN), or combinations thereof. The p-type WFM layer 308 may be formed by a deposition process such as ALD, CVD, PVD, and/or other suitable processes. Therefore, depending on the desired work function on the fin 207b, the p-type WFM layer 308 may have any suitable thickness, such as about 1 nm to about 2 nm. In an embodiment, for patterning efficiency, the p-type WFM layer 308 is less than 1.5 nm thick. Further, as shown in FIG. 3C, in at least one embodiment, the p-type WFM layer 308 is in direct contact with the high-k dielectric layer 304 without any intermediate layer such as a barrier layer or a high-k cap layer (e.g., silicon nitride).

Figure 3D:
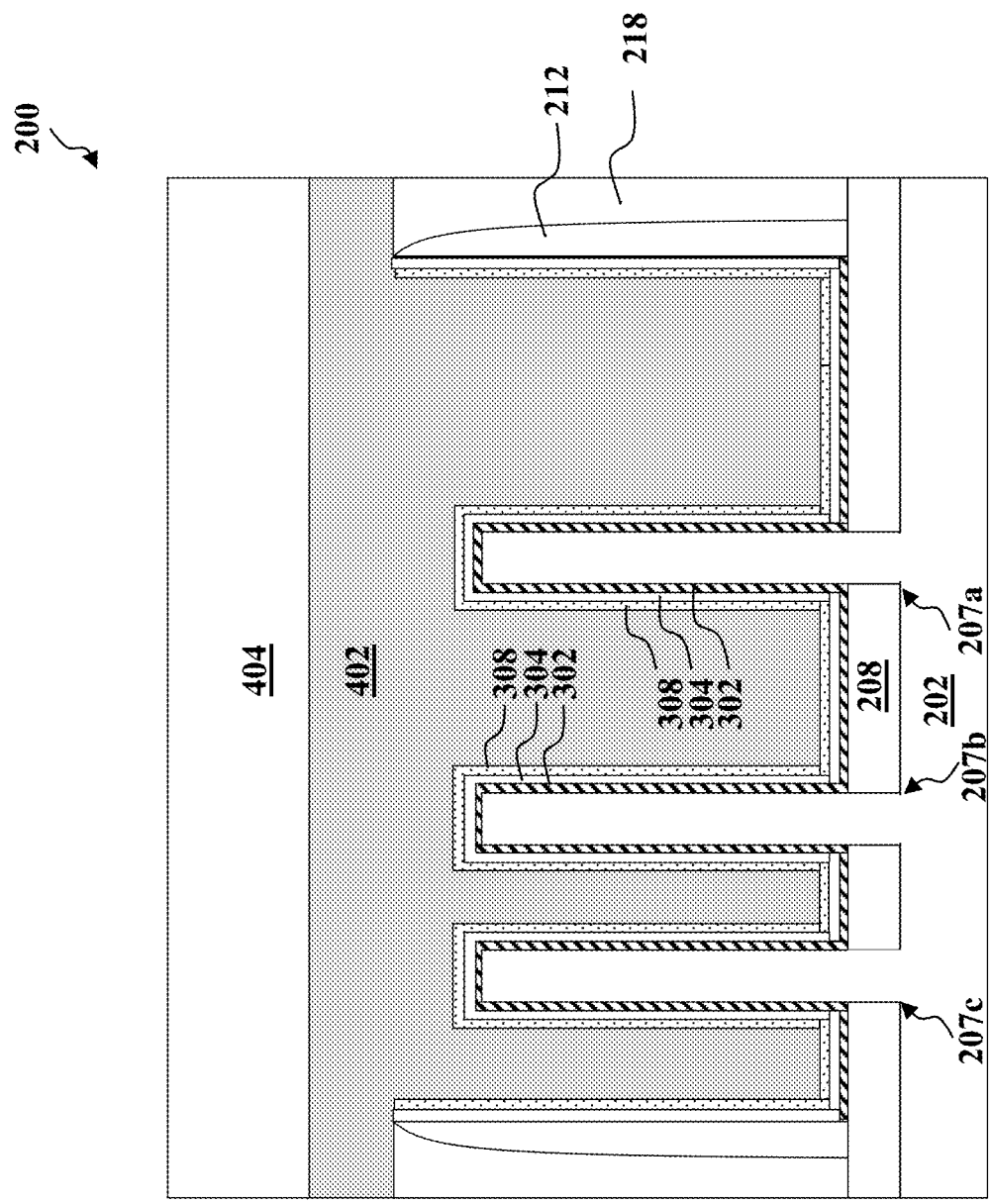
Figure 3E:
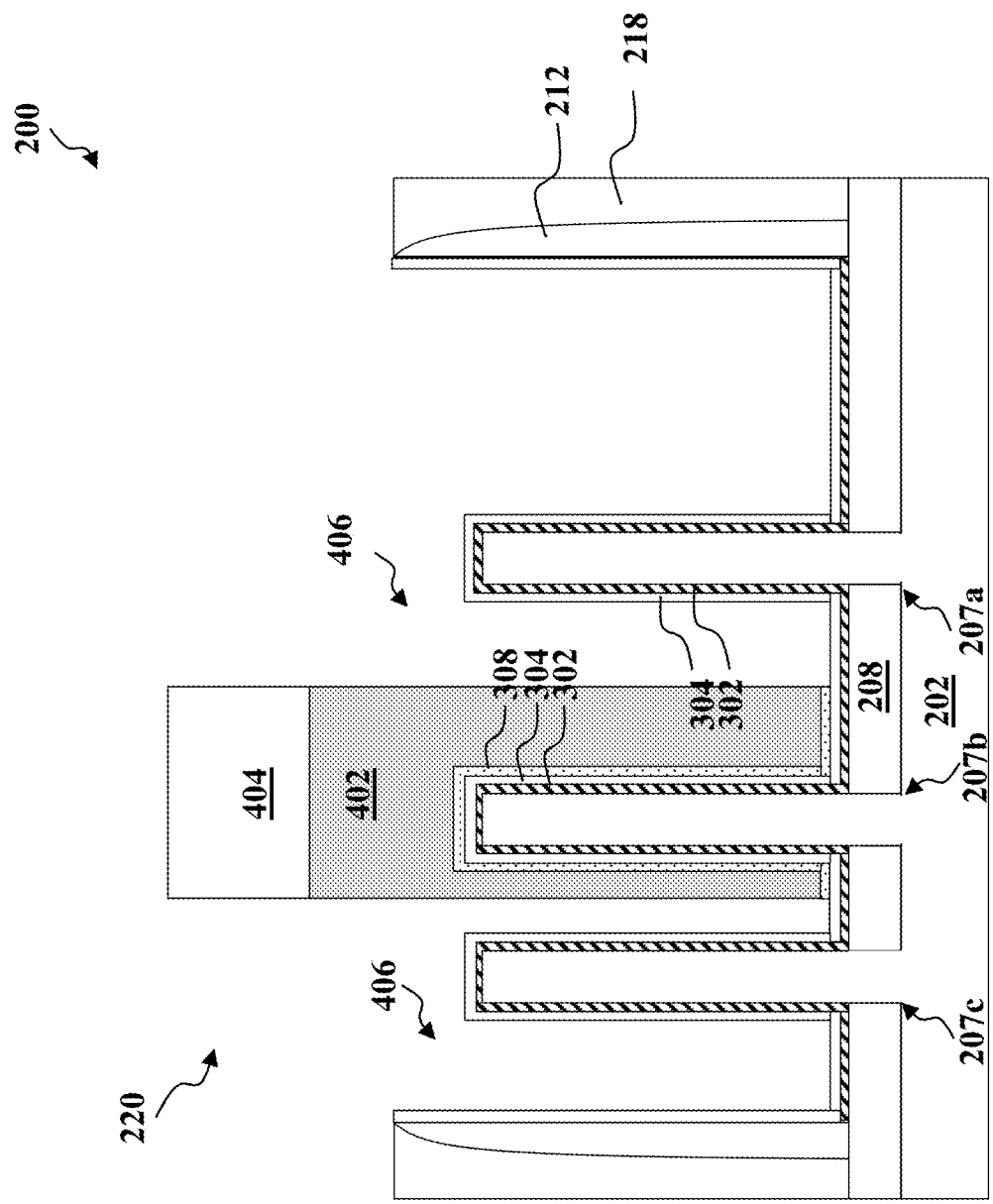

Referring to FIG. 1 and FIGS. 3D-3F, the method 100 at operation 110 patterns the p-type WFM layer 308 by removing the p-type WFM layer 308 over the fins 207a and 207c, thereby leaving the p-type WFM layer 308 over the fin 207b. As shown in FIG. 3D, the method 100 may first form a masking element—which includes a resist layer 404 and optionally a resist bottom layer 402 such as a bottom antireflective coating (BARC)—over the gate trench 220 as well as portions of the ILD layer 218. As shown in FIG. 3E, the method 100 then proceeds to form openings 406 to expose the high-k dielectric layer 304 on the fins 207a and 207c (but not on the fin 207b). The openings 406 may be formed by exposing the resist layer 404 and the resist bottom layer 402 to a pattern, performing post-exposure bake processes, and developing the resist. Alternatively, the openings 406 may be formed by etching (dry etching, wet etching, ME, etc.) and/or other suitable processes. In an embodiment, the openings 406 are formed by etching selective portions of the resist layer 404 and resist bottom layer 402 shown in FIG. 3D, where the selective etching involves a dry etch process utilizing a nitrogen-containing etchant gas (e.g., $N_2$), a hydrogen-containing etchant gas (e.g., $H_2$), a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, and/or other suitable gases and/or plasmas. In an embodiment, the dry etch process implements a mixture of $N_2$ and $H_2$ gases.

Figure 3F:
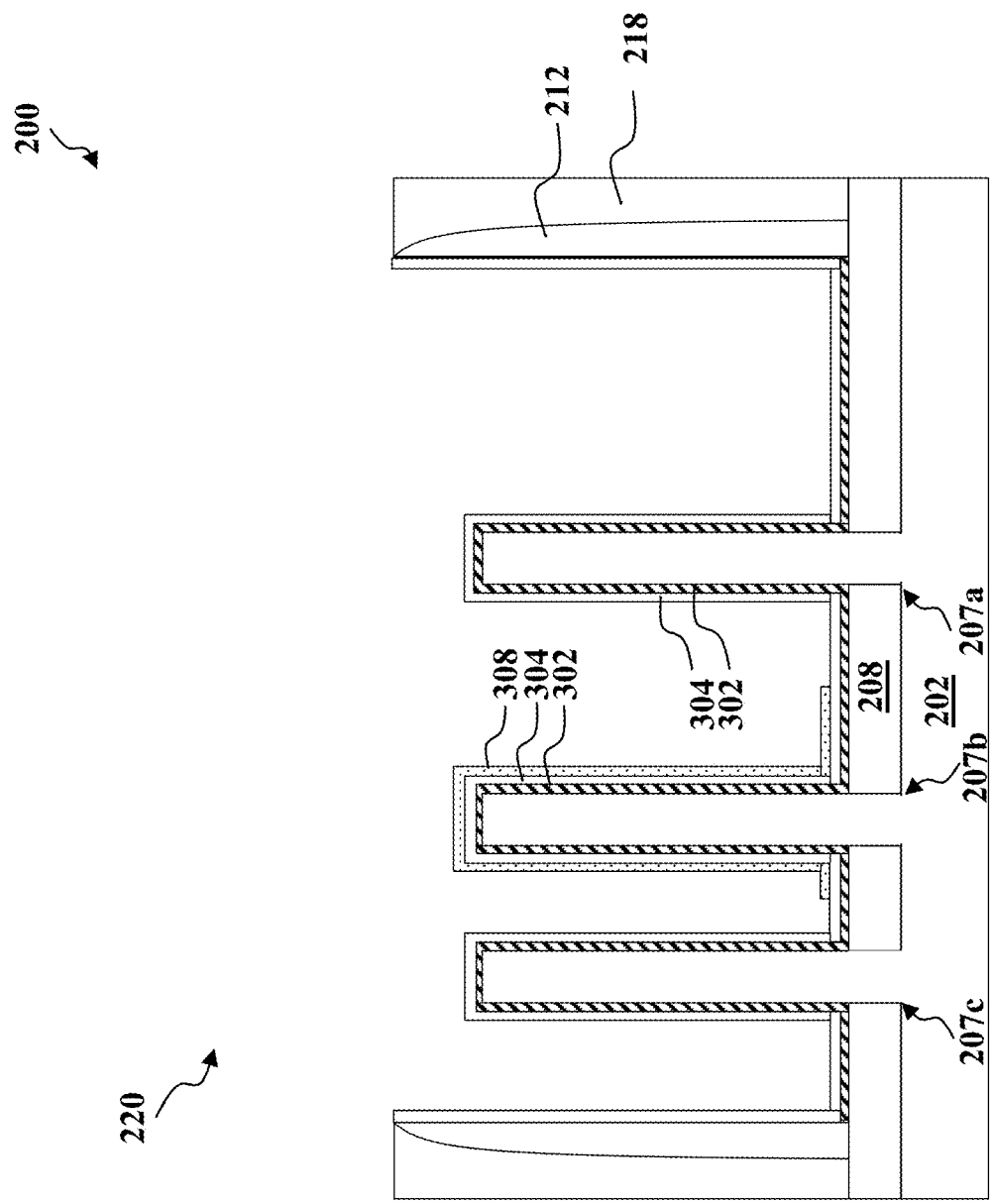

Still referring to FIG. 3E, the method 100 removes the exposed portions of the p-type WFM layer 308 in the gate trench 220 using an etch process, thereby exposing the high-k dielectric layer 304 on the fins 207a and 207c. Any suitable etch process including dry etching, wet etching, RIE, and/or other suitable processes may be used. A suitable etchant such as standard cleaning solutions SC1 (containing $NH_4OH$ or other alkaline solutions) and SC2 (containing hydrochloric, phosphoric, sulfuric acids or other acidic solutions) may be used to selectively etch the p-type WFM layer 308. Although the p-type WFM layer 308 is in direct contact with the high-k dielectric layer 304, the etch process does not remove or otherwise damage the high-k dielectric layer 304 due to etch selectivity between the p-type WFM layer 308 and the high-k dielectric layer 304. In some embodiments, an etchant removes the p-type WFM layer 308 at an etch rate that is at least 100 times faster than the high-k dielectric layer 304. Such a drastic difference in etch rates ensures that the removal of exposed portions of the p-type WFM layer 308 does not substantively remove or otherwise damage any portion of the high-k dielectric layer 304. Referring to FIG. 3F, the method 100 then removes the resist layer 404 and the resist bottom layer 402. Any suitable etch process may be used.

Figure 3G:
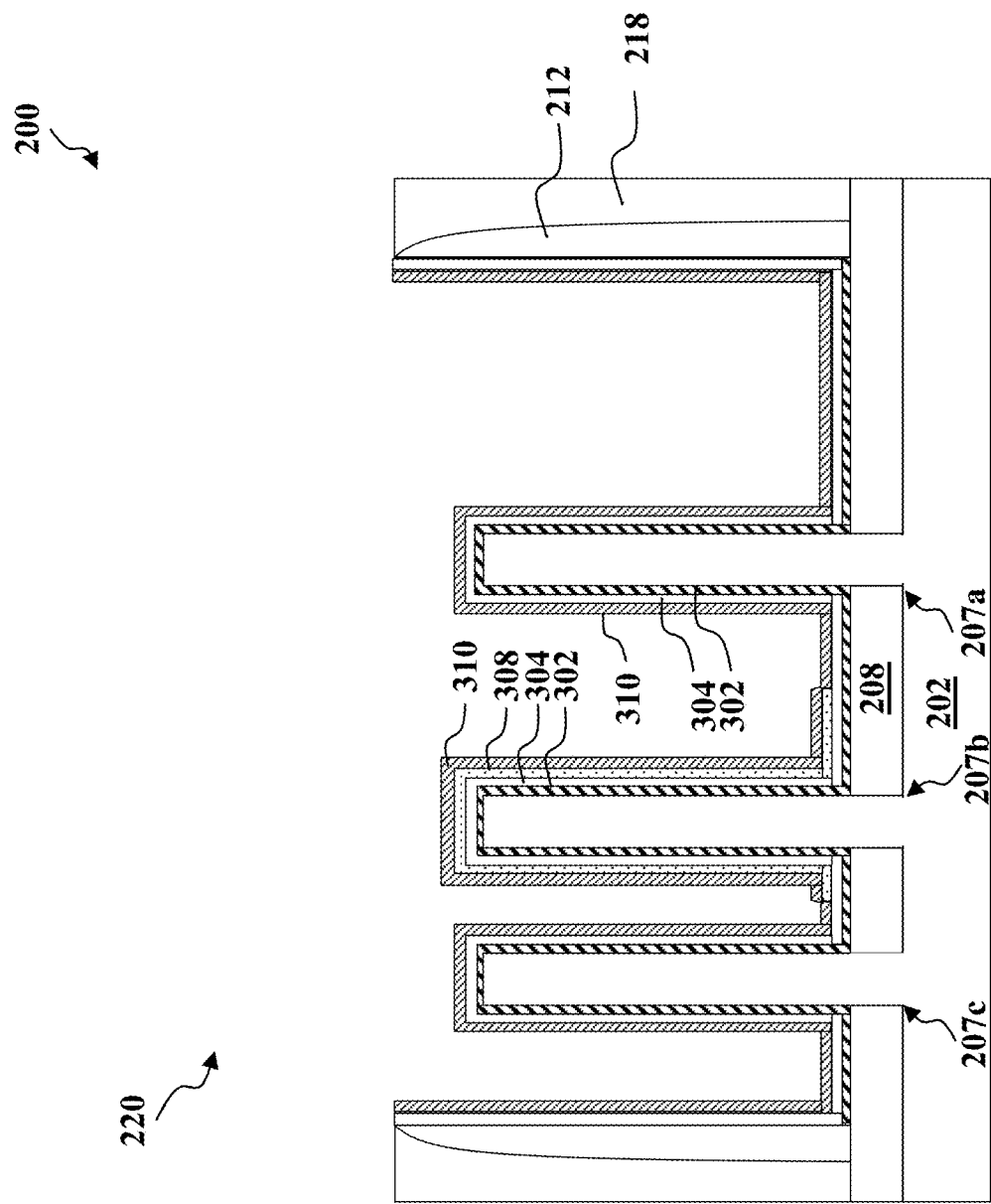

Referring to FIG. 1 and FIG. 3G, the method 100 at operation 112 forms an n-type WFM layer 310 on the patterned p-type WFM layer 308 in the gate trench 220. In many embodiments, the n-type WFM layer 310 is designed (in terms of material and/or thickness) to tune or modulate the threshold voltages of the fins 207a-207c. The n-type WFM layer 310 may include a metal with sufficiently low effective work function, selected from but not restricted to the group of titanium (Ti), aluminum (Al), titanium aluminum (TiAl), titanium aluminum carbide (TiAlC), titanium aluminum nitride (TiAlN), tantalum carbide (TaC), tantalum silicon carbide (TaSiC), tantalum aluminum carbide (TaAlC), tantalum carbide nitride (TaCN), tantalum silicon nitride (TaSiN), titanium silicon nitride (TiSiN), niobium aluminum carbide (NbAlC), hafnium carbide (HfC), or combinations thereof. The n-type WFM layer 310 may be formed by a deposition process such as ALD, CVD, PVD, and/or other suitable processes. Depending on the desired work functions on the fins 207b and 207c, the n-type WFM layer 310 may be formed to a suitable thickness (e.g., about 2 nm to about 3 nm).

Figure 3H:
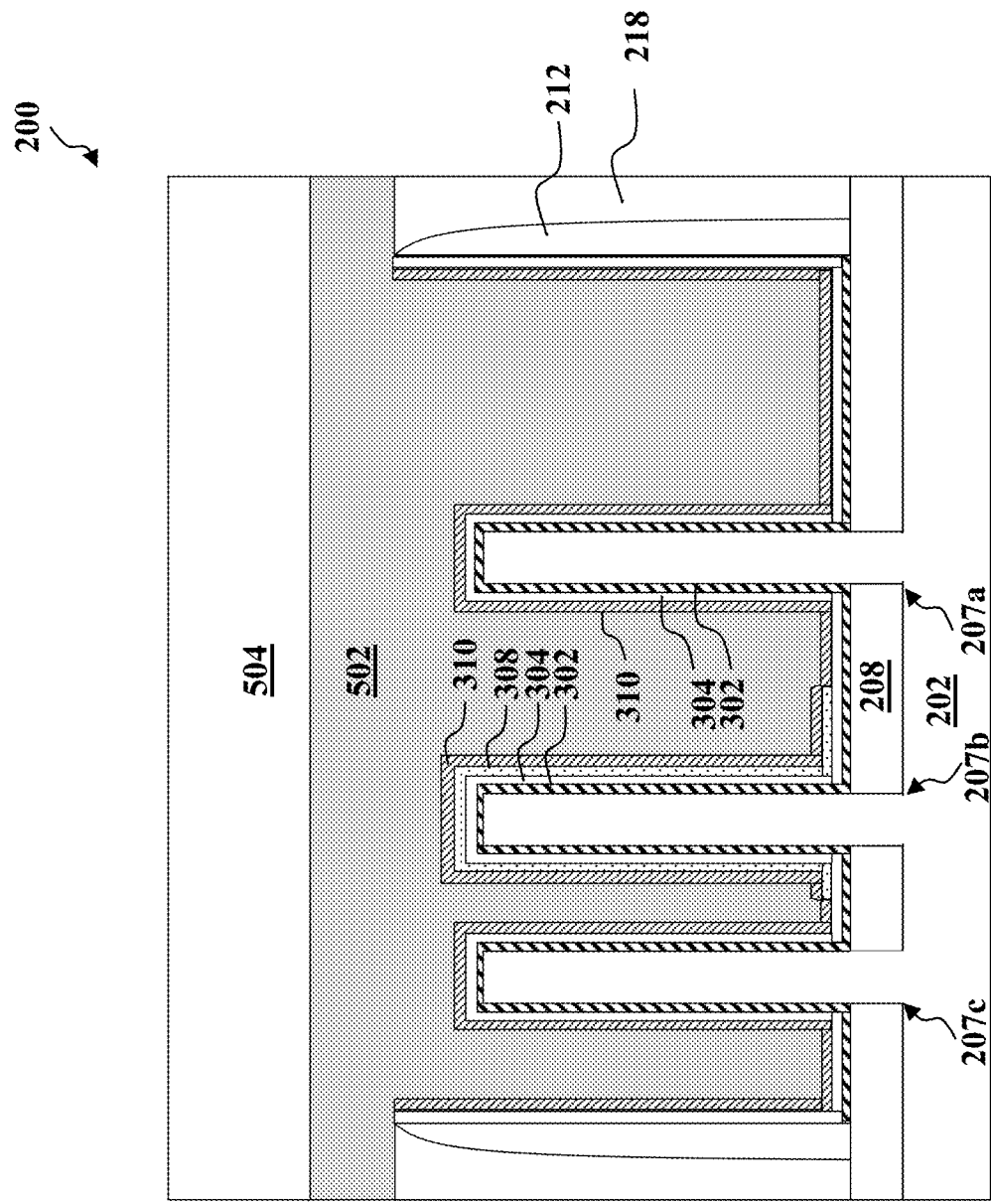

Referring to FIG. 1 and FIGS. 3H-3J, the method 100 at operation 114 patterns the n-type WFM layer 310 by removing their portions formed on the fin 207a, while keeping portions formed on the fins 207b and 207c. As shown in FIG. 3H, the method 100 may first form a masking element over the gate trench 220, and then proceed to form an opening 418 to expose the n-type WFM layer 310 on the fin 207a (but not the n-type WFM layer 310 on the fins 207b and 207c). The masking element may be similar to what was used earlier for patterning the p-type WFM layer 308 (FIGS. 3D and 3E). For example, the masking element includes a resist layer 504 and a resist bottom layer 502, which are similar to the resist layer 404 and the resist bottom layer 402, respectively, as described above. The opening 418 may be formed by any suitable processes such as exposing the resist layer 504 and the resist bottom layer 502 to a pattern, performing post-exposure bake processes, developing the resist, or etching (dry etching, wet etching, RIE, etc.), and/or other suitable processes.

Figure 3I:
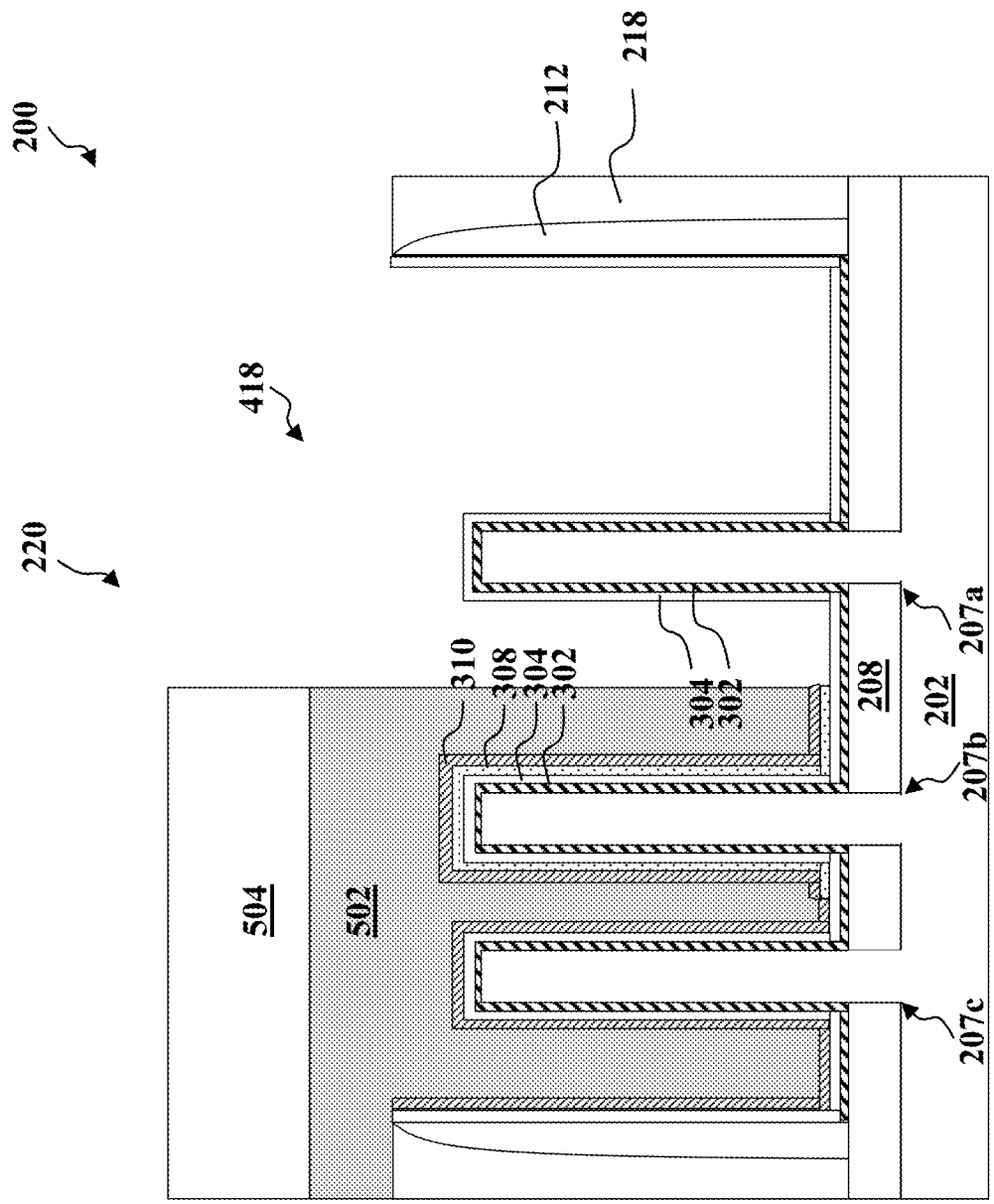

As shown in FIG. 3I, the method 100 patterns the n-type WFM layer 310 by removing the portion of the n-type WFM layer 310 in the opening 418, thereby exposing a portion of the high-k dielectric layer 304 in the opening 418. The resist layer 504 and the resist bottom layer 502 protect portions of the n-type WFM layer 310 that are disposed on the fins 207b and 207c against etchants used in operation 114, thereby allowing patterning of the n-type WFM layer 310. Any suitable patterning process including dry etching, wet etching, ME, and/or other suitable processes may be used. Any suitable etchant such as standard cleaning solutions SC1 (with $NH_4OH$ or other alkaline solutions) and SC2 (with hydrochloric, phosphoric, sulfuric acids or other acidic solutions) may be used to selectively etch the n-type WFM layer 310.

When patterning the n-type WFM layer 310, which is in direct contact with the high-k dielectric layer 304, the etchant does not remove or otherwise damage the high-k dielectric layer 304 due to etch selectivity between the n-type WFM layer 310 and the high-k dielectric layer 304. As described above, the high-k dielectric layer 304 may be hafnium-based (e.g., hafnium oxide, hafnium silicon oxide, and/or hafnium zirconium oxide), while the n-type WFM layer 310 may be titanium-based (e.g., titanium aluminum, titanium aluminum carbide, titanium aluminum nitride), so they may experience different etch rates. In some embodiments, an etchant removes the n-type WFM layer 310 at an etch rate that is at least 100 times faster than the high-k dielectric layer 304. In an embodiment, an overall thickness loss of the high-k dielectric layer 304 during the etch processes (including operations 110 and 114) is less than 1 angstrom (Å). The high etch selectivity helps to reduce the overall thickness of work function layers. In some embodiments, a high-k cap layer such as titanium nitride or titanium silicon nitride on the high-k dielectric layer 304 is not required. Therefore, the disclosed etch processes simplify the fabrication process and save fabrication cost.

Figure 3J:
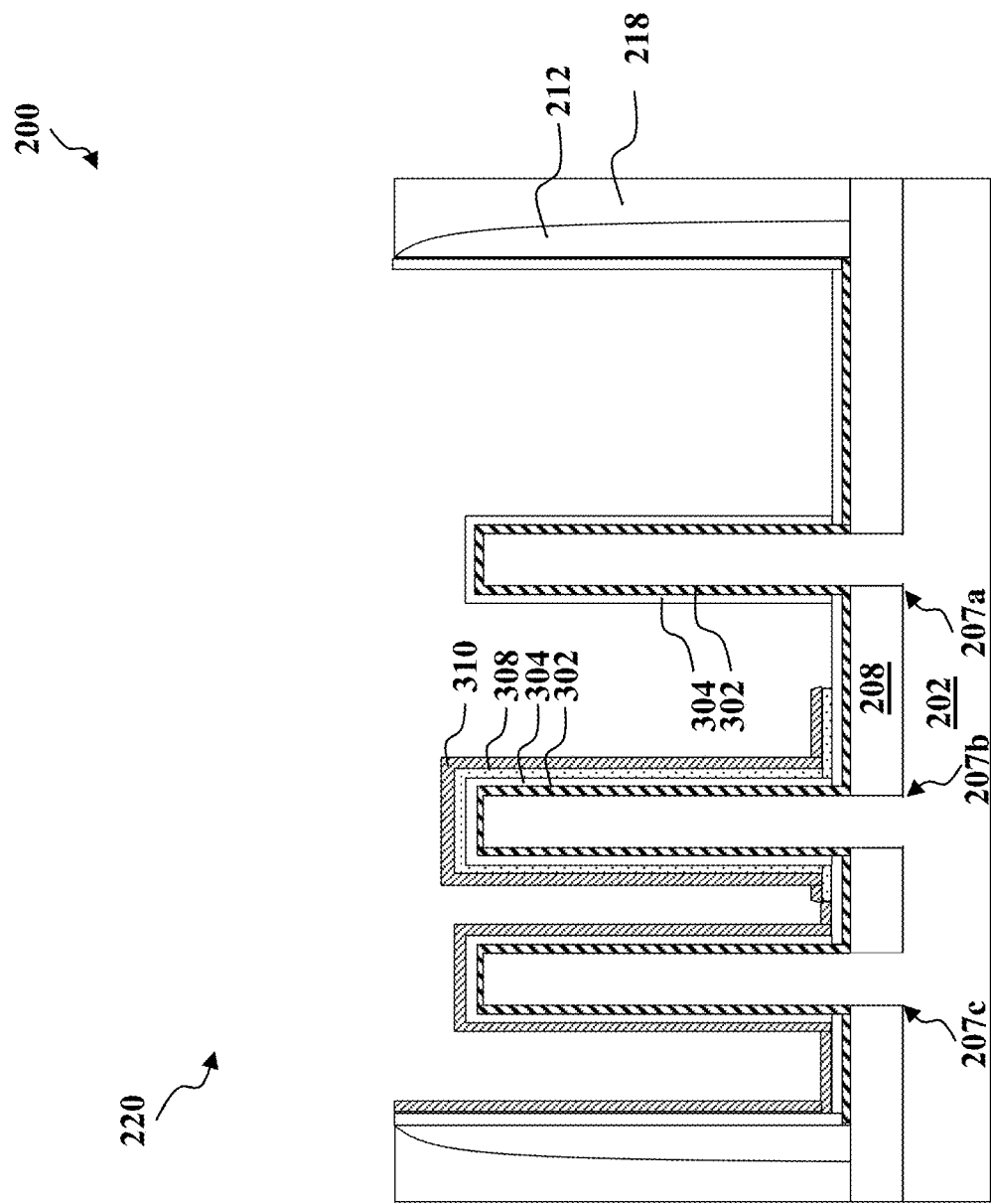

Still referring to FIG. 3I, when patterning the n-type WFM layer 310, the etchant does not substantially "undercut" masked portions of the n-type WFM layer 310 and the p-type WFM layer 308 that are disposed at the edge of the opening 418. In an embodiment, the lateral loss of the n-type WFM layer 310 and the p-type WFM layer 308 due to undercutting during the etch processes is less than 2 nm. Referring to FIG. 3J, after patterning the n-type WFM layer 310, the method 100 removes the remaining portions of the resist layer 504 and the resist bottom layer 502. Any suitable removal processes such as development of the resist layer 504 and the resist bottom layer 502 may be used. In some embodiments, the resist layer 504 and the resist bottom layer 502 may be removed in separate processes.

Figure 3K:
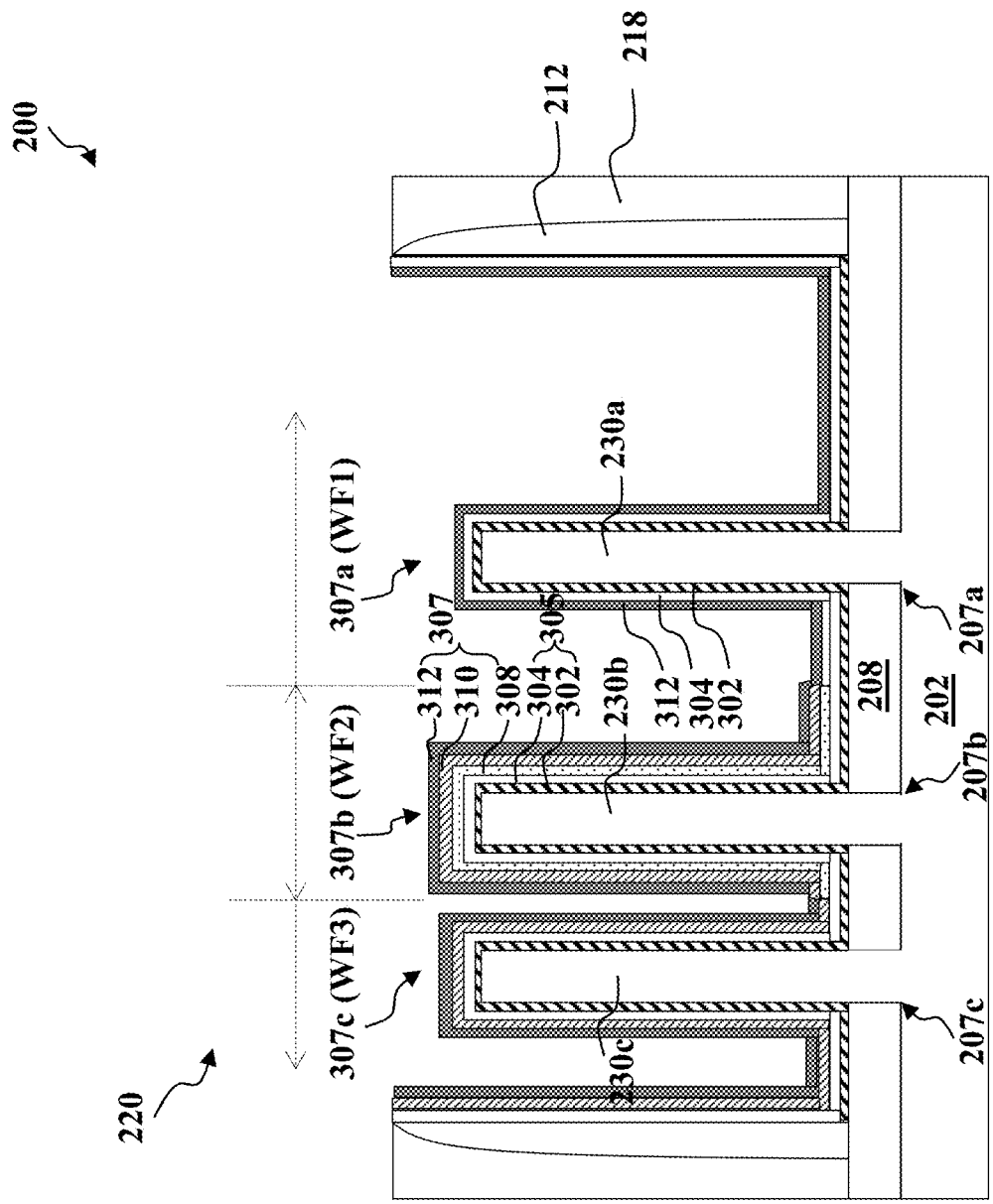
Figure 3L:
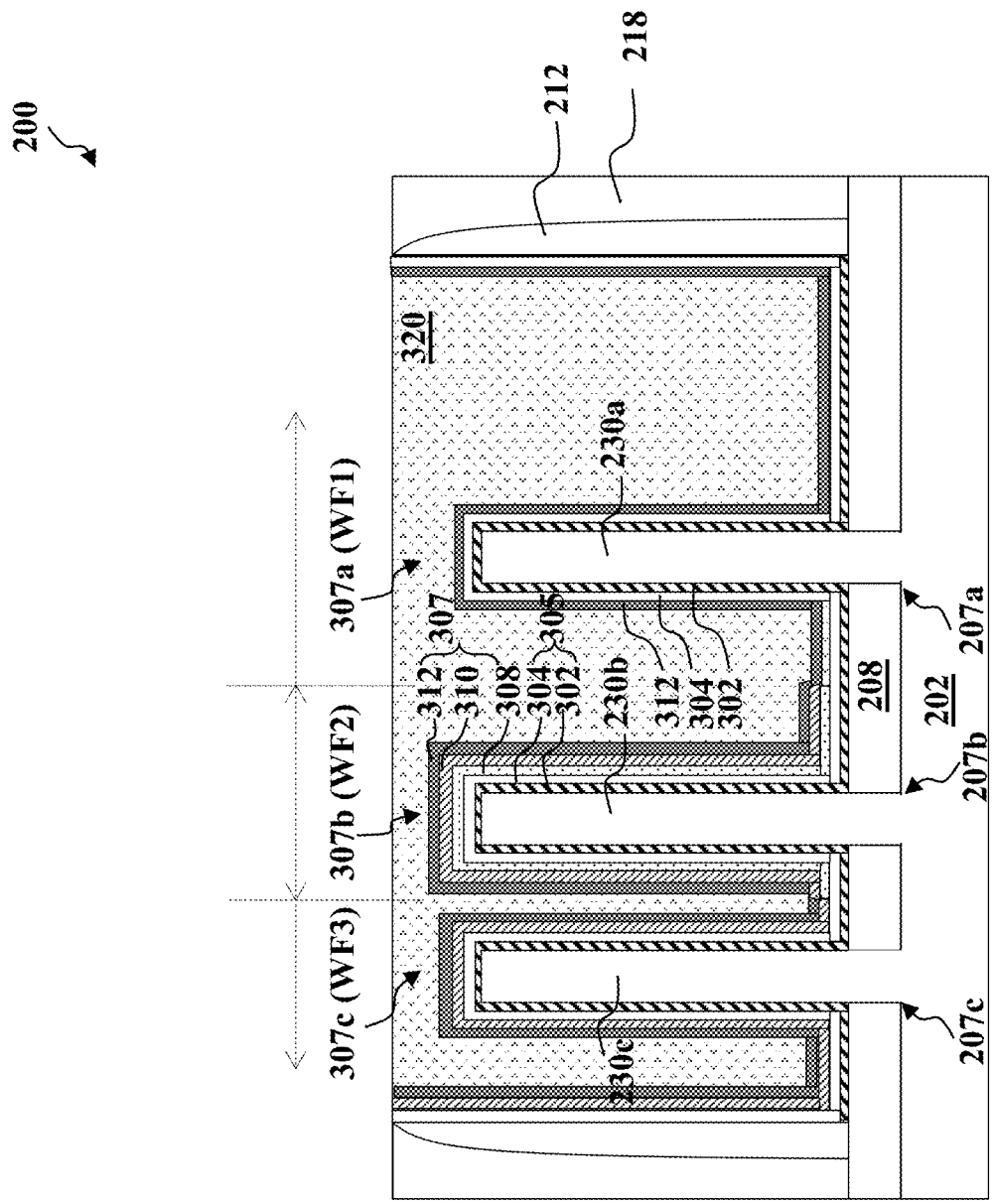

Referring to FIG. 1 and FIG. 3K, the method 100 at operation 116 forms a glue metal layer 312 in the gate trench 220 over the patterned n-type WFM layer and the high-k dielectric layer 304. In an embodiment, the glue metal layer 312 of a uniform thickness is formed to cover the fins 207a-207c. Alternatively, the glue metal layer 312 may have different thicknesses across the fins 207a-207c (e.g., thicker on the p-type fin 207a and thinner on the n-type fin 207c). The glue metal layer 312 may be deposited by ALD, CVD, PVD, and/or other suitable process. The glue metal layer 312 serves multiple purposes. For example, the glue metal layer 312 uses materials that promote or enhance adhesion to the fill metal layer 320, which is to be formed on the glue metal layer 312. The glue metal layer 312 also provides the desired work function and adjust Vt of the subsequent transistor. As illustrated herein, the fin 207a is used to implement p-type FinFETs, so the glue metal layer 312 is a p-type work function metal layer. In an embodiment, the glue metal layer 312 has a relatively small thickness (e.g., less than 3 nm, or about 2 nm to about 3 nm) over the fins 207a-207c in order to achieve a designed work function for the p-type FinFET on the fin 207a without significantly offsetting (raising) the work function values of an n-type FinFET on the fin 207c. Alternatively, the glue metal layer 312 may be thicker on the fin 207a and thinner on the n-type fin 207c. Due to its multiple purposes, the glue metal layer 312 may also be called a p-type WFM & glue layer.

The glue metal layer 312 uses any suitable metal configured to serve as a WFM of the fin 207a. The choice of metal to be included in the glue metal layer 312 may be determined by an overall threshold voltage desired for a FET device (e.g., n-type or p-type) formed on the fin 207a. Exemplary p-type work function metals include Ti, TiN, TaN, Ru, Mo, Al, WN, $ZrSi_2$, $MoSi_2$, $TaSi_2$, $NiSi_2$, WN, and/or combinations thereof. Note that, if the fin 207a is used to implement n-type FinFETs, suitable n-type work function metals such as Ti, Ag, TaAl, TaAlC, TiAlN, TaC, TaCN, TaSiN, Mn, Zr, and/or combinations thereof may instead be used. In some embodiments, the glue metal layer 312 does not significantly impact the work function (e.g., by keeping the glue metal layer 312 relatively thin), because the work function are substantially determined by the p-type WFM layer 308 and/or the n-type WFM layer 310.

According to some embodiments disclosed herein, the p-type WFM layer 308, the n-type WFM layer 310, and the glue metal layer 312 together form the WFM structure 307, which determines effective work functions of the FinFETs on the fins 207a-207c. The WFM structure 307 has different layers in different horizontal WFM portions 307a, 307b, and 307c. Specifically, in the WFM structure 307, the p-type WFM portion 307a formed over the fin 207a includes only the glue metal layer 312; the n-type WFM portion 307c formed over the fin 207c includes the n-type WFM layer 310 and the glue metal layer 312; and the WFM portion 307b includes the p-type WFM layer 308, the n-type WFM layer 310, and the glue metal layer 312. Thus, the p-type WFM portion 307a is thinner than (despite having a higher work function than) the n-type WFM portion 307c, which in turn is thinner than the WFM portion 307b. Such a thickness profile departs from other WFM structures (where a WFM portion needs to be the thickest to obtain the highest work function). Consequently, the present disclosure reduces an overall thickness of the WFM structure 307 across top surfaces of the fins 207a-207c. In some embodiments, the overall thickness of the WFM structure 307 (including the p-type WFM layer 308, the n-type WFM layer 310, and the glue metal layer 312) is about 3 nm to about 13 nm. The overall thickness may be determined based on factors such as electrical work function behavior for the selected gate structure as well as physical space limitations in terms of fin-to-fin pitch distance, gate length, metal gate height, etc. For example, in terms of electrical work function behavior, a WFM structure thicker than about 13 nm may not adequately respond to a WF read-out. In an embodiment, a fin-to-fin pitch distance is about 20 nm to about 40 nm, which is designed based on considerations including device density, fin etching capability, gate patterning window. As illustrated in FIG. 3K, the overall thickness of the WFM structure 307 is limited by the fin-to-fin pitch distance between fins 207b and 207c, as there needs to be some gap or space between the WFM portions 307b and 307c for forming a fill metal layer 320 (shown in FIG. 3L).

The present disclosure provides extremely high and/or extremely low work functions. As illustrated in FIG. 3K, the p-type WFM portion 307a formed over the p-type channel region 230a contains only the glue metal layer 312 and no n-type WFM layer. Therefore, the glue metal layer 312 may use p-type work function metals that achieve extremely high work functions. In some embodiments, the glue metal layer 312 has a work function equal to or greater than 4.8 eV. On the other hand, the n-type WFM portion 307c formed over the n-type channel region 230c contains only the n-type WFM layer 310 and the glue metal layer 312 (and not the p-type WFM layer 308). When an extremely low work function is desired on the n-type channel region 230c, the n-type WFM layer 310 may use n-type work function metals that achieve extremely low work functions. In some embodiments, the n-type WFM layer 310 has a work function equal to or less than 4.4 eV. In addition, the materials and the thicknesses of the n-type WFM layer 310 and the glue metal layer 312 may be tailored in a combined manner to provide both an extremely high work function (e.g., equal to or greater than 4.8 eV) and an extremely low work function (e.g., equal to or less than 4.4 eV) in the p-type WFM portion 307a and the n-type WFM portion 307c, respectively. For example, the glue metal layer 312 may use a thin layer of high work function metal, and the n-type WFM layer 310 may use a thick layer of low work function metal. The intermediate WFM portion 307b may be fine-tuned or customized to be either n-type or p-type by adjusting the materials and/or thicknesses of layers therein.

The present disclosure increases the number of possible work function and Vt values with less material layers in comparison with other approaches. As a benefit, there is now sufficient space to pattern WFM layers even when a pitch distance between fins becomes smaller. Without techniques disclosed herein, the n-type and p-type WFM layers would be thicker (or there would be more of these layers), and there would be no room between fins to properly fill the glue metal layer over the n-type and p-type WFM layers. Thus, multi-Vt capabilities may be realized herein in smaller transistor devices such as smaller FinFETs.

Referring to FIG. 1 and FIG. 3L, the method 100 at operation 118 forms a fill metal layer 320 in the remaining space of the gate trench 220 to complete a metal gate structure. The fill metal layer 320 may include copper (Cu), tungsten (W), aluminum (Al), cobalt (Co), and/or other suitable materials. The fill metal layer 320 may be formed by ALD, CVD, PVD, plating, and/or other suitable processes. A CMP process may be performed to remove excess materials to planarize a top surface of the device 200. After formation of the fill metal layer 320, the gate structure is complete. The gate structure (including the interfacial layer 302, the high-k dielectric layer 304, the WFM structure 307, and the fill metal layer 320) is formed over and surrounding a channel, which sits between a source and a drain on each fin. Thus, each fin is part of a FinFET, which includes a source, a drain, a channel, and a gate. When multiple sources, drains, and channels are implemented onto a fin, the fin may be considered part of multiple FinFETs. As shown in FIG. 3L, the fill metal layer 320 is disposed over and in direct contact with the WFM structure 307. Further, the WFM structure 307 is disposed over and in direct contact with the high-k dielectric layer 304. In other words, no intermediate layer such as a barrier layer or a high-k cap layer (e.g., silicon nitride) is used between the WFM structure 307 and the high-k dielectric layer 304. As a result, the WFM structure 307 is closer to the channel regions 230a-230c, which improves the efficiency of work function control.

As shown in FIG. 3L, by controlling the profiles of layers in the WFM structure 307, three different work functions are realized on the three fins 207a-207c. From right to left, the p-type fin 207a has the highest work function (WF1), the intermediate fin 207b has an intermediate work function (WF2), and the n-type fin 207c has the lowest work function (WF3). As a result, three different threshold voltages may be implemented on the fins 207a-207c. In an embodiment, the fin 207a has a p-type low Vt (P-LVt) having a WF of 4.7 eV, the fin 207b has either a p-type standard Vt (P-SVt) having a WF of 4.6 eV or an n-type standard Vt (N-SVt) having a WF of 4.5 eV, and the fin 207c has an n-type low Vt (N-LVt) having a WF of 4.4 eV. Thus, using techniques disclosed herein, specific Vt values and their corresponding work functions can be flexibly designed and tailored to fit various application needs.

Although the present disclosure mainly describes controlling metal layers in the WFM structure 307 to modulate work functions, it should be understood that the gate dielectric layer 305 may also be tuned, if needed, to realize diverse work functions. Such additional tuning capabilities further increases the number of possible work functions and Vt values.

FIG. 3L illustrates that the overall gate structure (including the interfacial layer 302, the high-k dielectric layer 304, the WFM structure 307, and the fill metal layer 320) connects and engages the fins 207a-207c. Therefore, a common gate structure may be used for both n-type and p-type FinFETs. In some embodiments, at operation 120, the method 100 may cut the gate structure to separate each FinFET that has a different threshold voltage. For example, via gate cutting, a p-type FinFET on the fin 207a may have a first gate structure, an n-type FinFET on the fin 207c may have a separate, second gate structure, and another n- or p-type FinFET on the fin 207b may have yet another separate, third gate structure. In some embodiments, two or more fins share the same gate structure, while other fins have separate gate structures. Additionally, the gate structure shown in FIG. 3L may also be shared with other fins not shown in FIG. 3L.

Subsequently, at operation 122, the method 100 performs additional processing steps to complete fabrication of the device 200. For example, vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

FIGS. 2A-2B and 3A-3L illustrates an embodiment where one gate trench 220 engages multiple fins 207a-207c. In other embodiments, separate gate trenches may be formed corresponding to different fins of predetermined threshold voltages. FIG. 4A is a fragmentary top view of another embodiment of a semiconductor device 400, where each gate trench corresponds to a predetermined threshold voltage, and FIG. 4B is a fragmentary Y-cut cross-sectional view of the same semiconductor device 400. The device 400 shown in FIGS. 4A and 4B is at the same manufacturing stage as the device 200 shown in FIGS. 2A and 2B. Numerous aspects of the device 400 are the same as the device 200, and the method 100 applies to the device 400 as it does to the device 200. Thus, in the interest of conciseness, only the differences between the devices 200 and 400 are further described. Unlike the device 200 which has one gate trench 220 engaging multiple FinFETs on fins 207a-207c with different threshold voltages, the device 400 has multiple gate trenches formed therein, including gate trenches 420 and 424, each engaging a separate a FinFET on a fin that has a different threshold voltage. Operations of the method 100 still work on the device 400, except where the single gate trench 220 is replaced with multiple gate trenches 420 and 424. Further, after execution of the method 100, the final device 400 has multiple gate structures separated by the gate spacers 212 and the ILD layer 218. For example, in the final device 400 a p-type FinFET on the fin 207a may have a first gate structure with a first Vt, and an n-type FinFET on the fin 207c may have a different gate structure with a different Vt. Although only two gate trenches 420 and 424 are illustrated in FIGS. 4A and 4B, additional gate trenches and fins can be formed using principles disclosed herein.

Although not intended to be limiting, one or more embodiments of the present disclosure provide many benefits to a semiconductor device and the formation thereof. For example, embodiments of the present disclosure provide methods for realizing extreme threshold voltages using a thin WFM structure. Gap-fill capability is improved on smaller FinFET devices. Patterning material layers at an early stage yields a larger patterning window. Further, common glue metal layer and fill metal layers are formed for multiple threshold voltages without extra patterning. Simplified fabrication reduces costs. The disclosed techniques may replace or supplement other Vt tuning techniques such as multiple patterning gate (MPG).

In one aspect, the present disclosure is directed to a method of integrated circuit (IC) fabrication includes exposing a plurality of channel regions including a p-type channel region and an n-type channel region; forming a gate dielectric layer over the exposed channel regions; and forming a work function metal (WFM) structure over the gate dielectric layer. The WFM structure includes a p-type WFM portion formed over the p-type channel region and an n-type WFM portion formed over the n-type channel region, and the p-type WFM portion is thinner than the n-type WFM portion. The method further includes forming a fill metal layer over the WFM structure such that the fill metal layer is in direct contact with both the p-type and n-type WFM portions.

In another aspect, the present disclosure is directed to a method of integrated circuit (IC) fabrication includes providing a semiconductor device structure that includes a substrate; a plurality of fins disposed over the substrate and extending in a first direction; and a gate trench disposed over the substrate and extending in a second direction that intersects the first direction, the gate trench exposing a portion of each of the plurality of fins. The method further includes depositing an interfacial layer over the exposed portions of the plurality of fins; depositing a high-k dielectric layer over the interfacial layer; and depositing an n-type work function metal (WFM) layer over the high-k dielectric layer. The n-type WFM layer is patterned to expose a portion of the high-k dielectric layer based on etch selectivity between the n-type WFM layer and the high-k dielectric layer. The method further includes depositing a p-type WFM layer over the patterned n-type WFM layer and the exposed portion of the high-k dielectric layer.

In yet another aspect, the present disclosure is directed to a semiconductor device includes a semiconductor substrate; a plurality of channel regions, including a p-type channel region and an n-type channel region, disposed over the semiconductor substrate; and a gate structure. The gate structure includes a gate dielectric layer disposed over the plurality of channel regions and a work function metal (WFM) structure disposed over the gate dielectric layer. The WFM structure includes a p-type WFM portion and an n-type WFM portion that are disposed over the p-type channel region and the n-type channel region, respectively, and wherein the p-type WFM portion is thinner than the n-type WFM portion. The gate structure further includes a fill metal layer disposed over both the n-type WFM portion and the p-type WFM portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a plurality of channel regions, including a p-type channel region, an n-type channel region, and a third channel region disposed over the semiconductor substrate; and
   a gate structure comprising:
   a gate dielectric layer disposed over the plurality of channel regions;
   a work function metal (WFM) structure disposed over the gate dielectric layer, wherein the WFM structure includes an n-type WFM layer over the n-type channel region and not over the p-type channel region or the third channel region and further includes a p-type WFM layer over both the n-type WFM layer and the p-type channel region and not the third channel region; and
   a fill metal layer.

2. The semiconductor device of claim 1, wherein the n-type WFM layer is disposed over and in direct contact with the gate dielectric layer.

3. The semiconductor device of claim 2, wherein the n-type WFM layer has a work function equal to or less than 4.4 eV.

4. The semiconductor device of claim 1, wherein the p-type WFM layer is in direct contact with the gate dielectric layer.

5. The semiconductor device of claim 4, wherein the p-type WFM layer has a work function equal to or greater than 4.8 eV.

6. The semiconductor device of claim 1, wherein the p-type and n-type channel regions are first and second channel regions respectively, wherein a first effective work function of the WFM structure over the first channel region is higher than a second effective work function of the WFM structure over the third channel region that is higher than a third effective work function of the WFM structure over the second channel region.

7. The semiconductor device of claim 1, further comprising a plurality of FinFETs disposed over the semiconductor substrate, wherein each of the plurality of FinFETs includes:
   a source;
   a drain; and
   a respective one of the plurality of channel regions that is disposed between the source and the drain.

8. The semiconductor device of claim 7, wherein the gate structure is configured to implement a different threshold voltage for the p-type channel region, the n-type channel region, and the third channel region.

9. The semiconductor device of claim 1, wherein the p-type WFM layer includes Ti, Mo, Al, $ZrSi_2$, $MoSi_2$, $TaSi_2$, $NiSi_2$, or WN.

10. A semiconductor device, comprising:
   a semiconductor substrate;
   multiple channel regions, including a p-type channel region an n-type channel region, and a third channel region, disposed over the semiconductor substrate;
   a high-k gate dielectric layer disposed over each of the channel regions;
   an n-type WFM layer over the n-type channel region and not over the p-type channel region or the third channel region, wherein the high-k gate dielectric layer is disposed between the n-type WFM layer and the n-type channel region;
   a p-type WFM layer over the n-type WFM layer and over the p-type channel region, but not over the third channel region, wherein the high-k gate dielectric layer is disposed between the p-type WFM layer and the p-type channel region; and
   a fill metal layer disposed over the high-k gate dielectric layer.

11. The semiconductor device of claim 10, further comprising a dielectric interfacial layer between the high-k gate dielectric layer and each of the channel regions.

12. The semiconductor device of claim 10, wherein the p-type WFM layer includes Ti, Ru, Mo, Al, $ZrSi_2$, $MoSi_2$, $TaSi_2$, $NiSi_2$, or WN.

13. The semiconductor device of claim 10, wherein the n-type WFM layer is in direct contact with the high-k gate dielectric layer that is over the n-type channel region.

14. The semiconductor device of claim 10, wherein the p-type WFM layer is in direct contact with the high-k gate dielectric layer that is over the p-type channel region.

15. The semiconductor device of claim 10, wherein a first portion of the fill metal layer over the n-type channel region and a second portion of the fill metal layer over the p-type channel region are connected.

16. A semiconductor device, comprising:
   a semiconductor substrate;
   a p-type channel region, an n-type channel region, and a third channel region disposed over the semiconductor substrate;
   a high-k gate dielectric layer disposed over each of the p-type channel region and the n-type channel region;
   an n-type WFM layer over the n-type channel region and not over the p-type channel region or the third channel region, wherein the n-type WFM layer is over and in direct contact with the high-k gate dielectric layer;
   a p-type WFM layer over both the n-type channel region and the p-type channel region, but not over the third channel region;
   a glue metal layer over all three regions, wherein the high-k gate dielectric layer is disposed between the glue metal layer and the p-type channel region, wherein the glue metal layer is configured to provide a p-type work function over the p-type channel region, wherein the glue metal layer is over and in direct contact with the high-k gate dielectric layer; and
   a fill metal layer disposed over and in direct contact with the glue metal layer.

17. The semiconductor device of claim 16, wherein the glue metal layer includes Ti, Ru, Mo, Al, $ZrSi_2$, $MoSi_2$, $TaSi_2$, $NiSi_2$, or WN.

18. The semiconductor device of claim 16, wherein each of the p-type channel region, the n-type channel region, and the third channel region includes a semiconductor fin.

19. The semiconductor device of claim 1 further comprising:
   a p-type glue layer disposed under the fill metal layer.

20. The semiconductor device of claim 10 further comprising:
   a glue layer disposed under the fill metal layer.

* * * * *